(12) United States Patent
Happ et al.

(10) Patent No.: US 7,824,951 B2
(45) Date of Patent: Nov. 2, 2010

(54) METHOD OF FABRICATING AN INTEGRATED CIRCUIT HAVING A MEMORY INCLUDING A LOW-K DIELECTRIC MATERIAL

(75) Inventors: Thomas Happ, Pleasantville, NY (US); Shoaib Zaidi, Poughkeepsie, NY (US)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 12/050,727

(22) Filed: Mar. 18, 2008

(65) Prior Publication Data

US 2008/0158943 A1  Jul. 3, 2008

Related U.S. Application Data

(62) Division of application No. 11/054,853, filed on Feb. 10, 2005, now Pat. No. 7,361,925.

(51) Int. Cl.
*H01L 21/00* (2006.01)
(52) U.S. Cl. .................. 438/95; 438/103; 257/E21.583
(58) Field of Classification Search .................. 438/95, 438/102, 103, 131, 132; 257/E21.086
See application file for complete search history.

(56) References Cited

U.S. PATENT DOCUMENTS

| | | | |
|---|---|---|---|
| 5,751,012 A | 5/1998 | Wolstenholme et al. | |
| 5,837,564 A | 11/1998 | Sandhu et al. | |
| 6,339,544 B1 | 1/2002 | Chiang et al. | |
| 6,507,061 B1 | 1/2003 | Hudgens et al. | |
| 6,625,054 B2 | 9/2003 | Lowrey et al. | |
| 6,673,648 B2 | 1/2004 | Lowrey | |
| 6,791,102 B2 | 9/2004 | Johnson et al. | |
| 6,791,107 B2 | 9/2004 | Gill et al. | |
| 6,937,507 B2 | 8/2005 | Chen | |
| 7,018,918 B2 * | 3/2006 | Kloster et al. | 438/623 |
| 2002/0017701 A1 | 2/2002 | Klersy et al. | |
| 2002/0168852 A1 * | 11/2002 | Harshfield et al. | 438/650 |
| 2003/0003647 A1 | 1/2003 | Dennison et al. | |
| 2003/0156468 A1 * | 8/2003 | Campbell et al. | 365/200 |
| 2003/0194865 A1 | 10/2003 | Gilton | |
| 2004/0051094 A1 | 3/2004 | Ooishi | |
| 2004/0251551 A1 | 12/2004 | Hideki | |

(Continued)

FOREIGN PATENT DOCUMENTS

DE  10236439  2/2004

(Continued)

OTHER PUBLICATIONS

Ha, Y. H. et al., "An Edge Contact Type Cell for Phase Change RAM Featuring Very Low Power Consumption," Symposium on VLSI Technology Digest of Technical Papers, pp. 2, (2003).

(Continued)

*Primary Examiner*—Hoai V Pham
(74) *Attorney, Agent, or Firm*—Dicke, Billig, Czaja, PLLC

(57) ABSTRACT

The present invention includes a memory cell device and method that includes a memory cell, a first electrode, a second electrode, phase-change material and an isolation material. The phase-change material is coupled adjacent the first electrode. The second electrode is coupled adjacent the phase-change material. The isolation material adjacent the phase-change material thermally isolates the phase-change material.

9 Claims, 4 Drawing Sheets

U.S. PATENT DOCUMENTS

2006/0092693 A1    5/2006    Chen
2006/0163554 A1    7/2006    Lankhorst et al.

FOREIGN PATENT DOCUMENTS

DE    10231646    1/2007
EP    1318552    6/2003

OTHER PUBLICATIONS

Horii, H. et al., "A Novel Cell Technology Using N-Doped GeSbTe Films for Phase Change RAM," Symposium on VLSI Technology Digest of Technical Papers, pp. 2, (2003).

Hwang, Y.N. et al., "Full Integration and Reliability Evaluation of Phase-Change RAM Based on 0.24μm-CMOS Technologies," pp. 2, (2003).

Lai, Stefan et al., "OUM-A 180 nm Nonvolatile Memory Cell Element Technology for Stand Alone and Embedded Applications," IEDM Technical Digest, Session 36.5, pp. 4, (2001).

Pellizzer, F. et al., "Novel μTrench Phase-Change Memory Cell for Embedded and Stand-Alone Non-Volatile Memory Applications," VLSI Technology Digest of Technical Papers, pp. 2, (2004).

A translation of the Notification of Reasons for Refusal for Application No. 10 2007 7020518 mailed Jun. 24, 2008 (3 pgs.).

* cited by examiner

US 7,824,951 B2

METHOD OF FABRICATING AN INTEGRATED CIRCUIT HAVING A MEMORY INCLUDING A LOW-K DIELECTRIC MATERIAL

CROSS-REFERENCE TO RELATED APPLICATIONS

This application is a Divisional application of U.S. patent application Ser. No. 11/054,853, entitled "INTEGRATED CIRCUIT HAVING A MEMORY INCLUDING A LOW-K DIELECTRIC MATERIAL FOR THERMAL ISOLATION," filed Feb. 10, 2005, now U.S. Pat. No. 7,361,925, and is incorporated herein by reference.

BACKGROUND

The present invention relates to phase-change memories. In particular, a system and method are provided for a phase-change memory cell having a host material adjacent phase-change material such that heat leakage in the phase-change material is reduced. Phase-change materials may exhibit at least two different states. Consequently, phase-change material may be used in a memory cell to store a bit of data. The states of phase-change material may be referenced to as amorphous and crystalline states. The states may be distinguished because the amorphous state generally exhibits higher resistivity than does the crystalline state. Generally, the amorphous state involves a more disordered atomic structure, while the crystalline state is an ordered lattice.

Phase change in the phase-change materials may be induced reversibly. In this way, the memory may change from the amorphous to the crystalline state, and visa versa, in response to temperature changes. The temperature changes to the phase-change material may be achieved in a variety of ways. For example, a laser can be directed to the phase-change material, current may be driven through the phase-change material, or current or voltage can be fed through a resistive heater adjacent the phase-change material. With any of these methods, controllable heating of the phase-change material causes controllable phase change within the phase-change material.

When a phase-change memory comprises a memory array having a plurality of memory cells that are made of phase-change material, the memory may be programmed to store data utilizing the memory states of the phase-change material. One way to read and write data in such a phase-change memory device is to control a current and/or a voltage pulse that is applied to the phase-change material. The level of current and voltage generally corresponds to the temperature induced within the phase-change material in each memory cell. In order to minimize the amount of power that is required in each memory cell, the amount of heat the leaks from the phase-change material should be minimized.

For these and other reasons, there is a need for the present invention.

SUMMARY

One aspect of the present invention provides a memory cell device and method that includes a memory cell, a first electrode, a second electrode, phase-change material and an isolation material. The phase-change material is coupled adjacent the first electrode. The second electrode is coupled adjacent the phase-change material. The isolation material adjacent the phase-change material thermally and electrically insulates the phase-change material.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
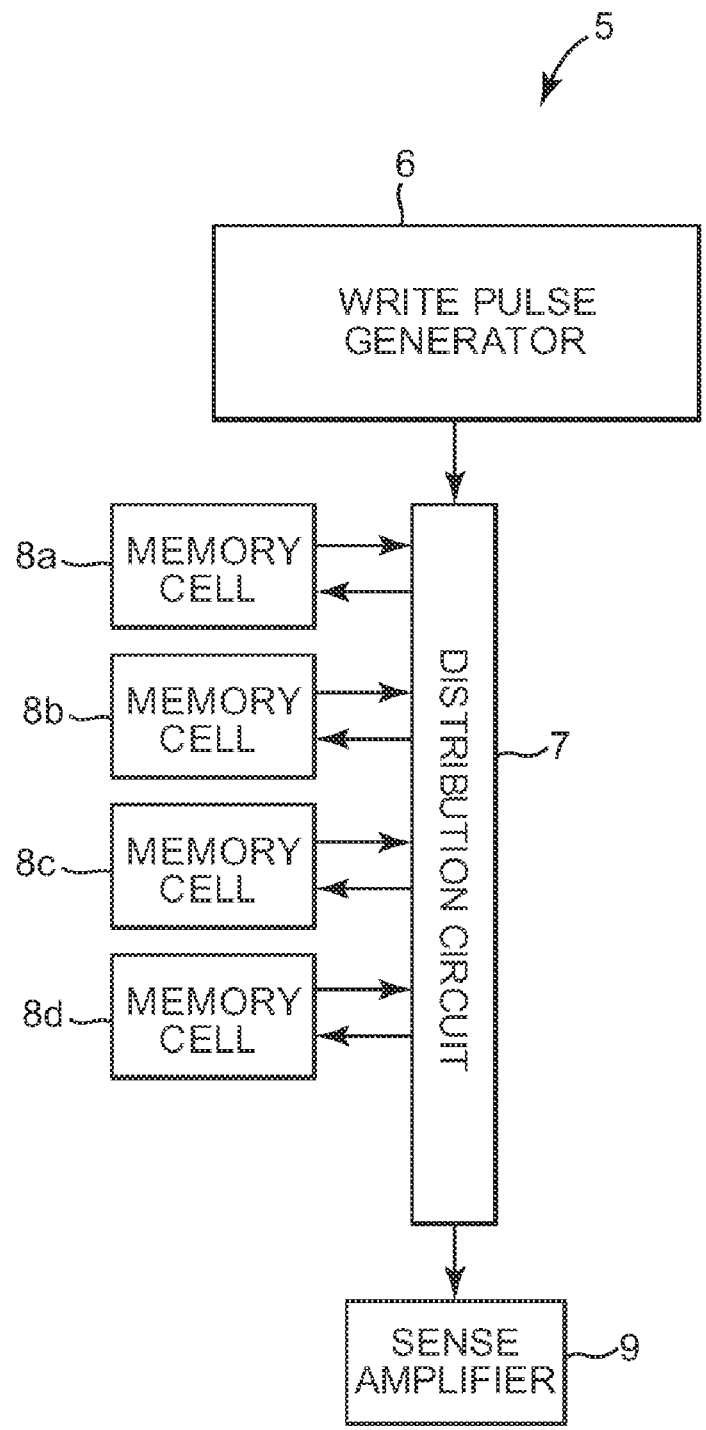
FIG. 1 illustrates a block diagram of a memory cell device.

FIG. 1 illustrates a block diagram of a memory cell device 5. Memory cell device 5 includes write pulse generator 6, distribution circuit 7, and memory cells 8a, 8b, 8c, and 8d and a sense amplifier 9. In one embodiment, memory cells 8a-8d are phase-change memory cells that are based on the amorphous to crystalline phase transition of the memory material. In one embodiment, write pulse generator 6 generates current or voltage pulses that are controllable directed to memory cells 8a-8d via distribution circuit 7. In one embodiment, distribution circuit 7 is a plurality of transistors that controllable direct current or voltage pulses to the memory, and in another embodiment, is a plurality of transistors that controllable direct current or voltage pulses to heaters adjacent to the phase-change memory cells.

In one embodiment, memory cells 8a-8d are made of a phase-change material that may be changed from an amorphous state to a crystalline state or crystalline state to amorphous under influence of temperature change. The degree of crystallinity thereby defines at least two memory states for storing data within memory cell device 5, which can be assigned to the bit values "0" and "1". The bit states of memory cells 8a-8d differ significantly in their electrical resistivity. In the amorphous state, a phase-change material will exhibit significantly higher resistivity than it will in the crystalline state. In this way, sense amplifier 9 may read the cell resistance such that the bit value assigned to a particular memory cell 8a-8d can be determined.

In order to program a memory cell 8a-8d within memory cell device 5, write pulse generator 6 generates a current or voltage pulse for heating the phase-change material in the target memory cell. In one embodiment, write pulse generator 6 generates an appropriate current or voltage pulse, which is fed into distribution circuit 7 and distributed to the appropriate target memory cell 8a-8d. The current or voltage pulse amplitude and duration is controlled depending on whether the memory cell is being set or reset. Generally, a "set" operation of a memory cell is heating the phase-change material of the target memory cell above its crystallization temperature (but below its melting temperature) long enough to achieve the crystalline state. Generally, a "reset" operation of a memory cell is quickly heating the phase-change material of the target memory cell above its melting temperature, and then quickly quench cooling the material, thereby achieving the amorphous state.

Figure 2:
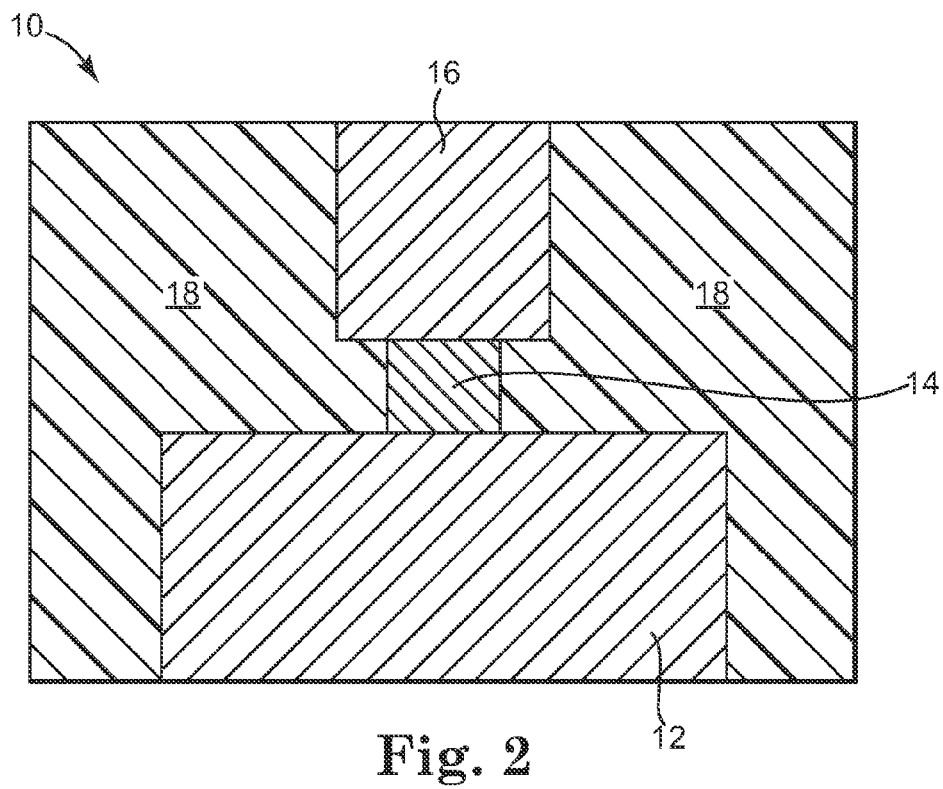
FIG. 2 illustrates a cross-sectional view through a phase-change memory cell.

FIG. 2 illustrates a cross-section view through an exemplary phase-change memory cell 10 of the active-in-via type. Phase-change memory cell 10 includes first electrode 12, phase-change material 14, second electrode 16, and insulator material 18. The phase change material 14 is laterally completely enclosed by insulation material 18, which defines the current path and hence the location of the phase change region in phase change material 14. A selection device, such as an active device like a transistor or diode, may be coupled to first electrode 12 to control the application of current or voltage to first electrode 12, and thus to phase-change material 14, in order to set and reset phase-change material 14.

In this way, during a set operation of phase-change memory cell 10, a set current or voltage pulse is selectively enabled to phase-change material 14 thereby heating it above its crystallization temperature (but below its melting temperature). In this way, phase-change material 14 reaches its crystalline state during this set operation. During a reset operation of phase-change memory cell 10, a reset current and/or voltage pulse is selectively enabled by the selection device and sent through first electrode 12 to phase-change material 14. The reset current or voltage quickly heats phase-change material 14 above its melting temperature, and then phase-change material 14 is quickly quench cooled to achieve its amorphous state.

Figure 3:
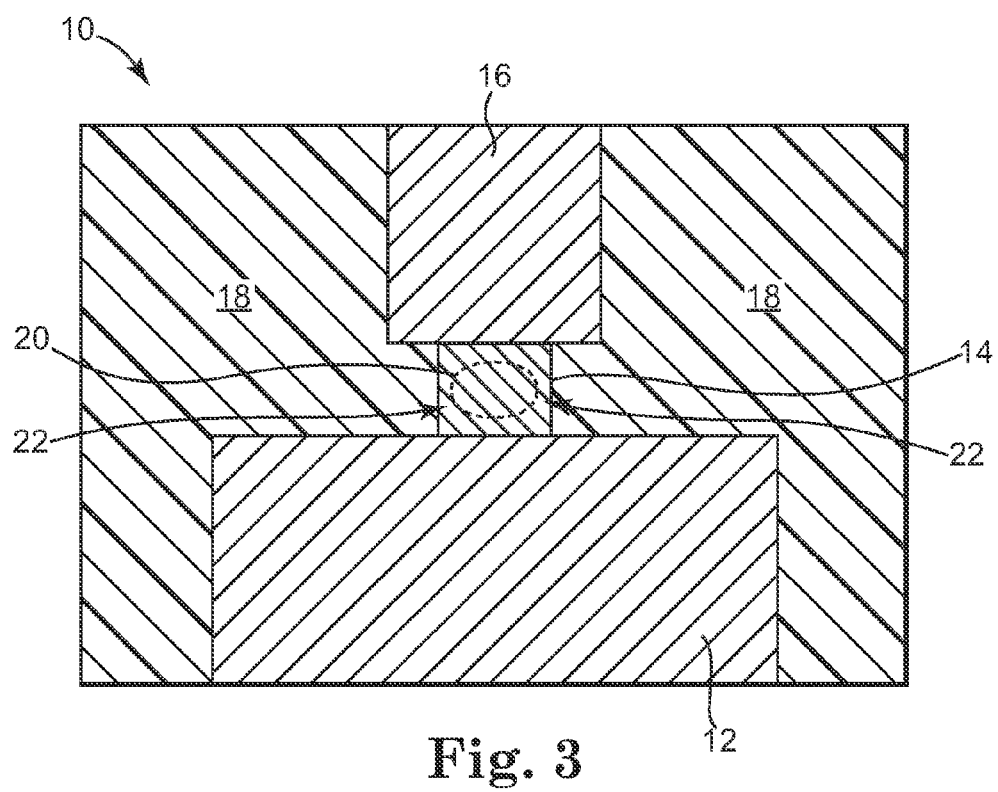
FIG. 3 illustrates a cross-sectional view through a phase-change memory cell with an illustrated temperature contour plot during a reset operation.

During a reset operation, phase-change material 14 typically begins heating and changing phases (melting) from the center of the cell due to thermal self-isolation of the phase-change material 14. Generated heat, however, may also diffuse into insulator material 18, which is typically an insulator material like silicon dioxide. Thus, in a low power reset operation, which avoids excessive overheating of the center, there is a crystalline, ring-shaped volume at the edge of phase-change material 14 remaining in the crystalline state due to incomplete melting. Such an incomplete melted area 22 is illustrated in FIG. 3, surrounding a sufficiently melted area 20 in phase-change material 14. A read operation undertaken subsequent to a reset in such a configuration provides low resistance shunt current paths in the area 22. This will mask the readout signal detected by sense amplifier 9 in the high resistance state.

Figure 4:
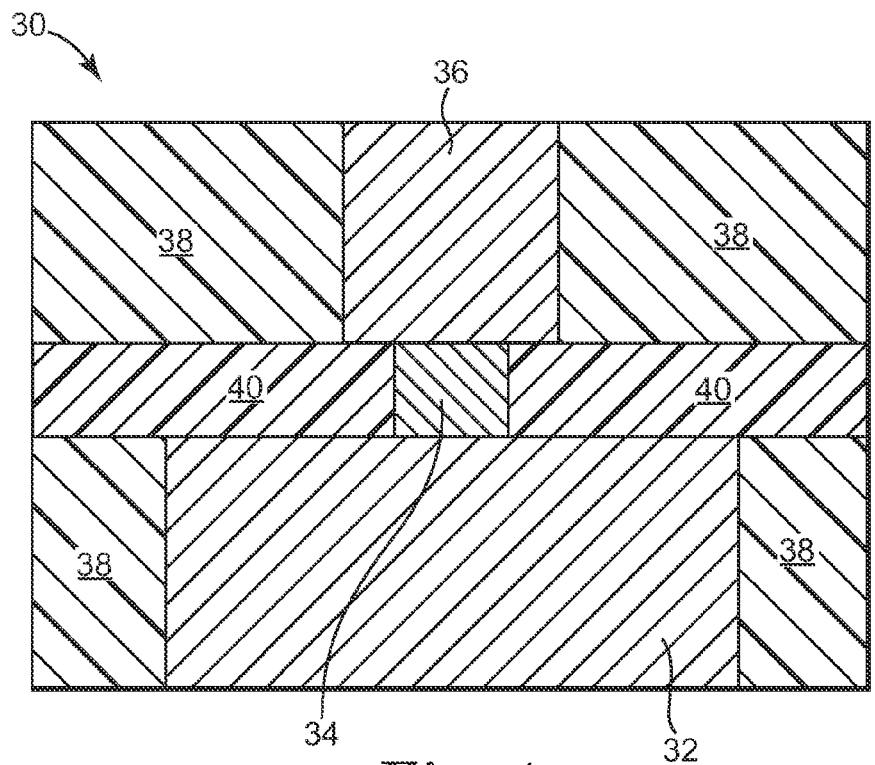
FIG. 4 illustrates a cross-sectional view through a phase-change memory cell with a laterally surrounding isolation material in accordance with one embodiment of the present invention.

FIG. 4 illustrates a cross-section view through an exemplary phase-change memory cell 30 in accordance with one embodiment of the present invention. Phase-change memory cell 30 includes first electrode 32, phase-change material 34, second electrode 36, and insulator material 38. In addition, phase-change memory cell 30 includes isolation material 40 adjacent phase-change material 34. In one embodiment, isolation material 40 is selected to have low thermal conductivity/diffusivity, thereby reducing the heat leakage from the edges of phase-change material 34.

In one embodiment, phase-change memory cell 30 in an active-in-via (AIV) cell such that a reset pulse typically melts phase-change material 34 starting at its center, and then the melting front moves outward. In one embodiment of phase-change memory cell 30, isolation material 40 surrounds phase-change material 34 at its outer edges. This reduces heat leakage from the edge of phase-change material 34 by the improved thermal insulation provided by the surrounding isolation material 40. In this way, unlike with phase-change memory device 10, melting of phase-change material 34 during a low power reset operation tends to go all the way out to its edge, thereby avoiding the crystalline, ring-shaped volume found in the prior embodiment.

Since even the outermost portions phase-change material 34 are melted (and subsequently amorphized during quench cooling), the total cell resistance will be much higher and read operation undertaken subsequent to a reset provides large read signals detected by sense amplifier 9. In this way, less input power is needed to achieve adequate read margins during reset operations. This allows lowering the reset pulse signal compared to a cell without isolation material 40, while still maintaining a switching of the full cell cross-section resulting in large read signals. Since the footprint of a scaled phase change memory cell is predominately determined by the width (and hence, area) of the select device required to drive the current during reset operation, this power reduction immediately translates into a more compact cell size.

Phase-change memory cell 30 may be fabricated in several ways in accordance with the present invention. For example, phase-change material 34 may be deposited and then etched, and then isolation material 40 formed adjacent to the edges of phase-change material 34. In addition, a layer of isolation material 40 may first be deposited, and then a via etched within the layer of isolation material 40. Phase-change material 34 may then be deposited in the via within the layer of isolation material 40.

Figure 5:
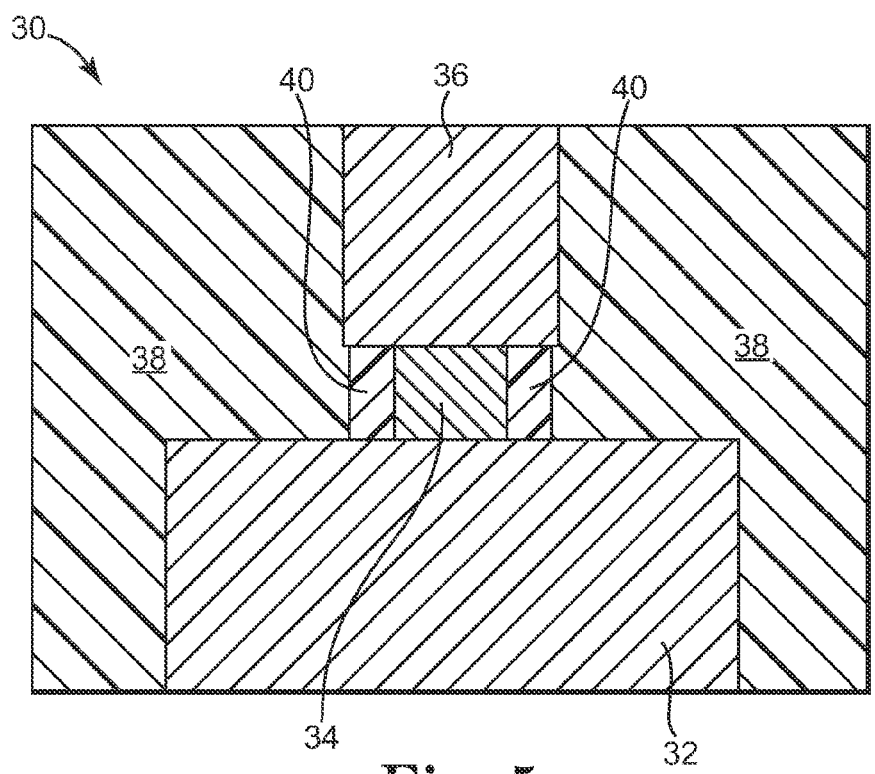
FIG. 5 illustrates a cross-sectional view through a phase-change memory cell with a laterally surrounding isolation material in accordance with another embodiment of the present invention.

FIG. 5 illustrates a cross-section view through an exemplary phase-change memory cell 30 in accordance with another embodiment of the present invention. Phase-change memory cell 30 includes first electrode 32, phase-change material 34, second electrode 36, and insulator material 38. In addition, phase-change memory cell 30 includes isolation material 40 adjacent phase-change material 34. Here, isolation material 40 is only placed immediately adjacent phase-change material 34, and is also selected to have low thermal conductivity. Thus, with this embodiment, less isolation material 40 is used, but heat leakage from the edges of phase-change material 34 is nonetheless effectively reduced. In this way, less additional input power is needed to achieve the increase in temperature that is needed for sufficient reset operations.

Figure 6:
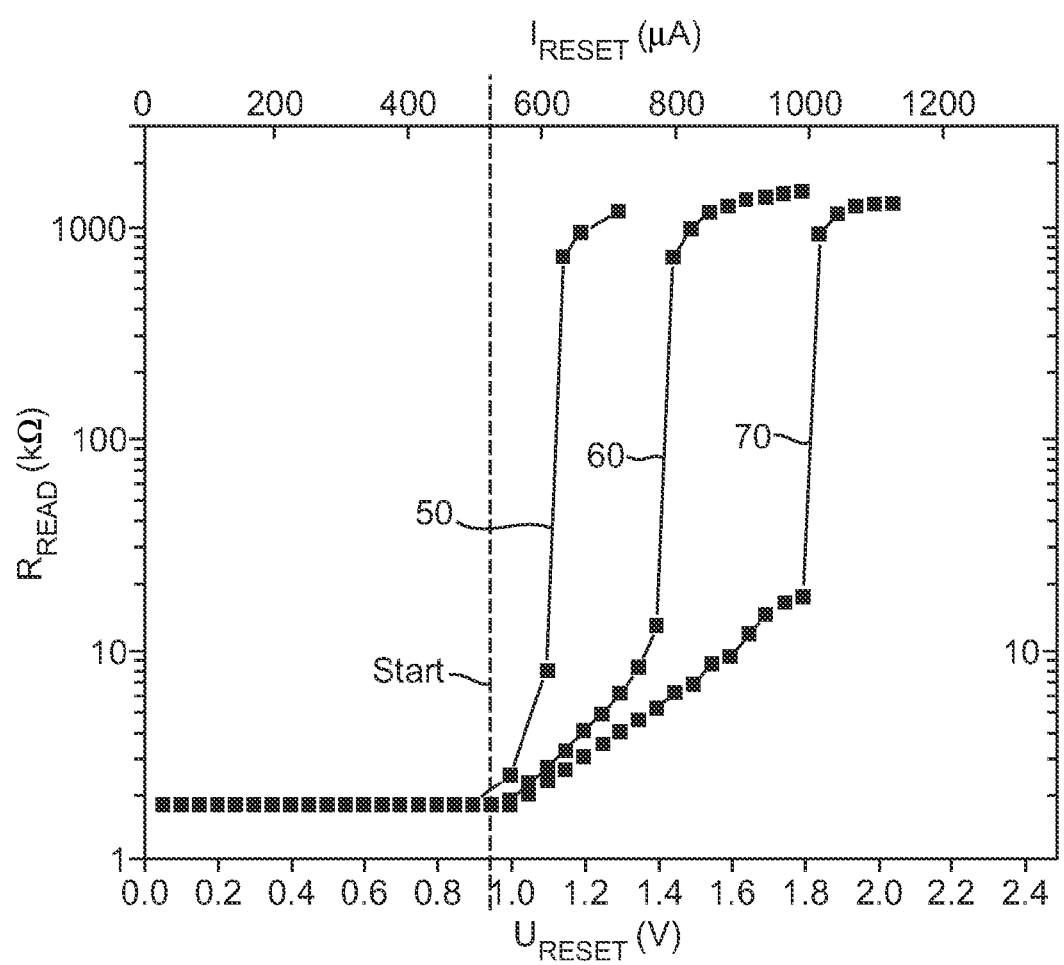
FIG. 6 illustrates a graph plotting the cell resistance as obtained during a read operation as a function of the reset pulse voltage and current.

FIG. 6 displays a graph plotting the cell resistance as obtained during a read operation as a function of the reset pulse voltage and current for three exemplary phase-change memory cells. The onset of melting at the center of the phase change cell is illustrated by a dotted vertical line. Line 70 in FIG. 6 illustrates the characteristics of a phase-change memory cell where the phase-change material is surrounded by silicon dioxide as insulating material. Here, during a low power reset around 1.0-1.5 V, the cell does not display a sharp switching characteristic, but instead displays a long lag phase having relatively low read resistance. This is due to the partial melting of the phase change material in the cell discussed earlier, which results in the highly conductive connection at the outer edge of the phase change material.

Line 60 in FIG. 6 illustrates the characteristics of a phase-change memory cell where the phase-change material is surrounded by a thermal insulating material having a relatively low dielectric constant ("low-k"), such as a porous oxide. Here, during a reset the read resistivity displays an improved switching characteristic over line 70, and displays shorter lag phase having relatively higher read resistance.

Line 50 in FIG. 6 illustrates the characteristics of a phase-change memory cell where the phase-change material is surrounded by a thermal insulating material having a relatively low-k, such as Aerogel. Here, during a reset the read resistance displays an improved and sharp switching characteristic over line 60, and the lag phase of line 70 virtually vanishes. The read resistance illustrates a sharp transition over several orders of magnitude.

In one embodiment, isolation material 40 is a good thermal insulator dielectric material such as a porous oxide film having a thermal conductivity between 0.1 and 0.8 W/(mK). In one embodiment, isolation material 40 may be a dielectric material such as Aerogel material with a thermal conductivity of about 0.12-0.18 W/mK, and in another it may be a templated porous oxide dielectric such as Philk with a thermal conductivity of about 0.13-0.17 W/mK.

Phase-change material 34 may be made up of a variety of materials in accordance with the present invention. Generally, chalcogenide alloys that contain one or more elements from Column IV of the periodic table are useful as such materials. In one embodiment, phase-change material 34 of memory cell 30 is made up of a chalcogenide compound material, such as GeSbTe or AgInSbTe. In another embodiment, the phase change material can be chalcogen-free such as GeSb, GaSb or GeGaSb.

Although the above-mentioned low-k dielectric materials function as isolation material 40 for these types of phase-change materials 34, other low-k dielectrics may also be usable for different types of phase-change materials that may be operated at relatively higher temperatures. Such low-k dielectric materials include SiLK, Coral, LDK-5109, Orion® 2.2, CF-Polymer, and others.

Use of a low-k dielectric material surrounding the phase-change material in a phase-change memory cell allows a lowering of the reset pulse power (current and/or voltage) compared to a phase-change cell without low-k dielectric material surrounding the phase-change material, while still maintaining a switching of the full cell cross-section resulting in large read signals. This allows for reduced phase-change memory cell size and thus chip size as well, allowing for increased chip density.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof

What is claimed is:

1. A method of fabricating an integrated circuit having a memory, the method comprising:
    fabricating a first electrode within an insulator material such that the first electrode has a width in a first direction;
    depositing a layer of resistivity changing material adjacent the first electrode;
    depositing a low-k dielectric material adjacent the layer of resistivity changing material such that the low-k dielectric material thermally isolates the resistivity changing material; and
    fabricating a second electrode within an insulator material such that the second electrode has a width in the first direction, such that it is adjacent the resistivity changing material, and such that the low-k dielectric material contacts a portion of each of the first and second electrodes;
    wherein fabricating the first electrode includes fabricating such that there is more contact between the first electrode and the low-k dielectric material across the width of the first electrode then there is contact between the first electrode and the resistivity changing material across the width of the first electrode; and
    wherein fabricating the second electrode includes fabricating such that there is less contact between the second electrode and the low-k dielectric material across the of width of the first electrode then there is contact between the second electrode and the resistivity changing material across the width of the second electrode.

2. The method of claim 1 wherein depositing the low-k dielectric material further comprises depositing the low-k dielectric material such that it thermally insulates the resistivity changing material in the plane orthogonal to a main current flow through the resistivity changing material.

3. The method of claim 1 further comprising depositing the low-k dielectric material such that it contacts a bottom portion of the second electrode.

4. The method of claim 1, wherein depositing a low-k dielectric material adjacent the layer of resistivity changing material further includes depositing a porous oxide film having a thermal conductivity between 0.1 and 1 W/mK.

5. The method of claim 1, wherein depositing a low-k dielectric material adjacent the layer of resistivity changing material further includes depositing a material selected from a group comprising Aerogel, Philk, SiLK, Coral, LDK-5109, Orion® 2.2, and CF-Polymer.

6. A method of fabricating an integrated circuit having a memory, the method comprising:
    fabricating a first electrode of the memory cell device within an insulator material such that the first electrode has a width in a first direction;
    depositing a low-k isolation material layer adjacent the first electrode;
    forming a via in the layer of low-k isolation material;
    depositing phase-change material within the via in the layer of low-k isolation material such that the low-k isolation material surrounds the phase-change material thereby limiting heat leakage from the phase change material; and
    fabricating a second electrode over the phase-change material and within an insulator material such that the second electrode has a width in the first direction and such that the low-k isolation material contacts a bottom portion of the second electrode and fabricating the first electrode such that the low-k isolation material contacts a top portion of the first electrode;

wherein fabricating the first electrode includes fabricating such that there is more contact between the top portion of the first electrode and the low-k dielectric material across the width of the first electrode then there is contact between the top portion of the first electrode and the resistivity changing material across the width of the first electrode; and wherein fabricating the second electrode includes fabricating such that there is less contact between the bottom portion of the second electrode and the low-k dielectric material across the of width of the first electrode then there is contact between the bottom portion of the second electrode and the resistivity changing material across the width of the second electrode.

7. The method of claim 6 wherein depositing the isolation material further comprises depositing a low-k dielectric material such that it thermally insulates the phase-change material in the plane orthogonal to a main current flow through the phase-change material.

8. The method of claim 7, wherein depositing a low-k dielectric material adjacent the layer of phase-change material further includes depositing a porous oxide film having a thermal conductivity between 0.1 and 1 W/mK.

9. The method of claim 7, wherein depositing a low-k dielectric material adjacent the layer of phase-change material further includes depositing a material selected from a group comprising Aerogel, Philk, SiLK, Coral, LDK-5109, Orion® 2.2, and CF-Polymer.

* * * * *